United States Patent
Ikenaga et al.

(10) Patent No.: US 6,703,694 B2
(45) Date of Patent: Mar. 9, 2004

(54) FRAME FOR SEMICONDUCTOR PACKAGE INCLUDING PLURAL LEAD FRAMES HAVING THIN PARTS OR HOLLOWS ADJACENT THE TERMINAL ROOTS

(75) Inventors: Chikao Ikenaga, Tokyo (JP); Kouji Tomita, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/850,213

(22) Filed: May 7, 2001

(65) Prior Publication Data

US 2001/0045630 A1 Nov. 29, 2001

(30) Foreign Application Priority Data

May 12, 2000 (JP) .................................... 2000-140008

(51) Int. Cl.$^7$ .............................................. H01L 23/495
(52) U.S. Cl. .................. 257/676; 257/692; 257/693; 257/787; 257/690; 257/670; 257/671
(58) Field of Search .................. 257/784, 796, 257/666, 669, 670, 671, 672, 674, 676, 678, 690, 692, 693, 696, 684, 787

(56) References Cited

U.S. PATENT DOCUMENTS

| | | | |
|---|---|---|---|
| 4,862,246 A | | 8/1989 | Masuda et al. |
| 5,293,066 A | * | 3/1994 | Tsumura ..................... 257/668 |
| 5,633,205 A | * | 5/1997 | Tsuchiya et al. .............. 29/827 |
| 5,753,535 A | * | 5/1998 | Ebihara ....................... 257/666 |
| 5,767,566 A | * | 6/1998 | Suda ........................... 257/666 |
| 5,942,794 A | * | 8/1999 | Okumura et al. ............ 257/666 |
| 5,969,412 A | | 10/1999 | Matsutomo |
| 5,977,615 A | * | 11/1999 | Yamaguchi et al. ......... 257/666 |
| 6,020,625 A | * | 2/2000 | Qin et al. .................... 257/666 |
| 6,100,598 A | * | 8/2000 | Kanesaka .................... 257/787 |
| 6,175,150 B1 | * | 1/2001 | Ichikawa et al. ............ 257/676 |
| 6,191,494 B1 | * | 2/2001 | Ooyama et al. ............. 257/796 |
| 6,229,200 B1 | * | 5/2001 | Mclellan et al. ............. 257/666 |
| 6,242,281 B1 | | 6/2001 | Mclellan et al. |
| 6,246,106 B1 | | 6/2001 | Sugimoto et al. |
| 6,300,224 B1 | | 10/2001 | Arima et al. |
| 6,355,502 B1 | * | 3/2002 | Kang et al. .................. 438/110 |
| 2001/0030355 A1 | | 10/2001 | Mclellan et al. |
| 2001/0040276 A1 | | 11/2001 | Yasunaga et al. |
| 2002/0189835 A1 | * | 12/2002 | Miyaki et al. ............. 174/52.1 |

OTHER PUBLICATIONS

Copy of U.S. application Ser. No. 09/850 212, filed May 7, 2001, Chikao Ikenaga and Kouji Tomita, Inventors, including specification, claims and drawings.

* cited by examiner

Primary Examiner—Nathan J. Flynn
Assistant Examiner—Pershelle Greene
(74) Attorney, Agent, or Firm—Flynn, Thiel, Boutell & Tanis, P.C.

(57) ABSTRACT

A frame for semiconductor packages has die-pads supported with suspending leads of individual lead frames. Semiconductor devices are mounted on the respective die-pads. These semiconductor devices are collectively molded with molding compound, and then the collectively molded semiconductor packages are cut into individual packages by means of a dicing saw. In the frame, thin parts are formed in areas corresponding to the roots of individual terminals, the thin parts being formed by half-etching metal of the areas from the front or back thereof. Alternatively, hollows are formed in areas corresponding to the roots of individual terminals.

17 Claims, 7 Drawing Sheets

FRAME FOR SEMICONDUCTOR PACKAGE INCLUDING PLURAL LEAD FRAMES HAVING THIN PARTS OR HOLLOWS ADJACENT THE TERMINAL ROOTS

BACKGROUND OF THE INVENTION

1. Field of the Invention

The present invention relates to a frame for a semiconductor package or packages in which a semiconductor device is mounted on a lead frame and the outside thereof, particularly the upper surface of semiconductor device, is encapsulated with molding compound.

2. Description of the Prior Art

In recent years, it has been required to miniaturize and shape a semiconductor product mounted on a substrate so as to be thinner, as the packaging of the semiconductor is made more dense. It has been required for LSI to reduce the number of chips by improving integration level and to miniaturize and make a package lighter. The popularity of so-called CSP (Chip Size Package) is rapidly increasing. Particularly, in the development of a thin semiconductor product with a lead frame, the semiconductor package of the single side encapsulation type has been developed in which a semiconductor device is mounted on a lead frame and the surface of the semiconductor device mounted on a lead frame is encapsulated with molding compound.

Figure 1:
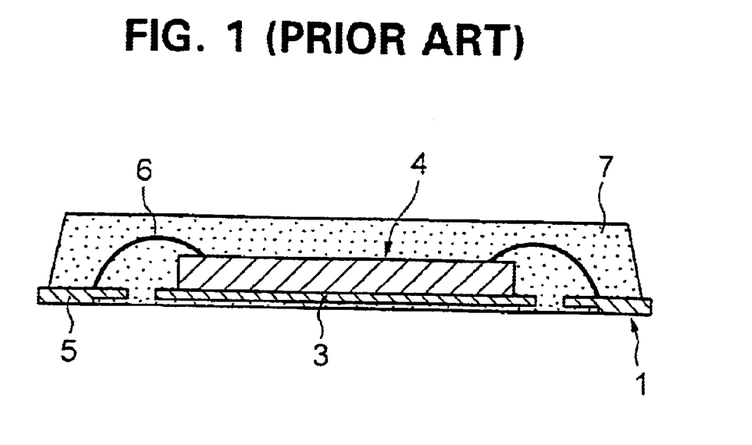
FIG. 1 is a sectional view of one example of a semiconductor package.
Figure 2:
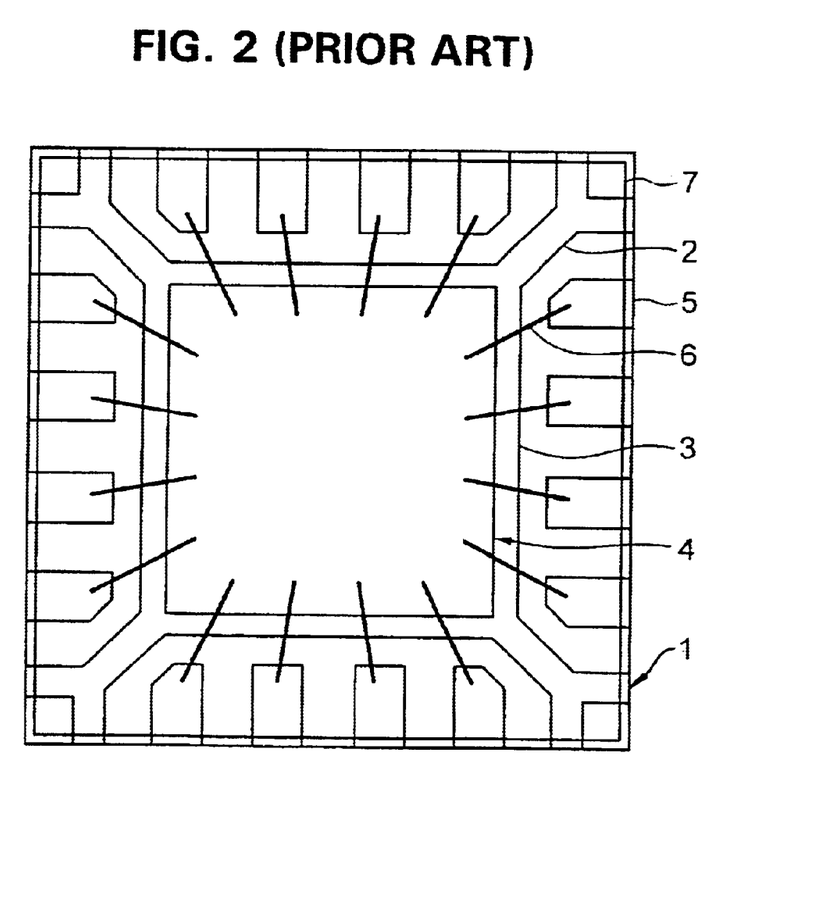
FIG. 2 is a plan view of the semiconductor package shown in FIG. 1.

FIG. 1 is a sectional view of one example of a semiconductor package. FIG. 2 is a plan view thereof. The semiconductor package shown in FIGS. 1 and 2 is comprised of a lead frame 1, a semiconductor device 4 mounted on a die-pad 3 supported with suspending leads 2 of lead frame 1, metallic thin wires 6 electrically connecting electrodes provided on the top face of,the semiconductor device 4 with terminals 5 of lead frame 1, respectively and molding compound 7 for encapsulating the outside region of semiconductor device 4 including the upper side of semiconductor device 4 and the lower side of die-pad 3. The semiconductor package is of the non-lead type in which so-called outer leads do not project from the semiconductor package and two of the inner leads and outer leads are integrated into terminals 5, wherein lead frame 1 is half-cut by etching in such a manner that die-pad 3 is positioned higher than terminals 5. Since such a step is formed between die pads 3 and terminals 5, molding compound 7 can be inserted into the lower side of die-pad 3 so that a thin semiconductor package can be realized even though the semiconductor package has a non-exposed die-pad.

Since the semiconductor device is miniature, a matrix type frame is mainly used for the above-mentioned semiconductor package of the non-lead type, in which plural semiconductor devices are arranged in a direction of a width of the matrix type frame. Further, recently, due to a demand for lower cost, one thought is to switch from a frame of the individually molded type shown in FIG. 3(A) to a frame of the collectively molded type shown in FIG. 4(A).

Figure 3A:
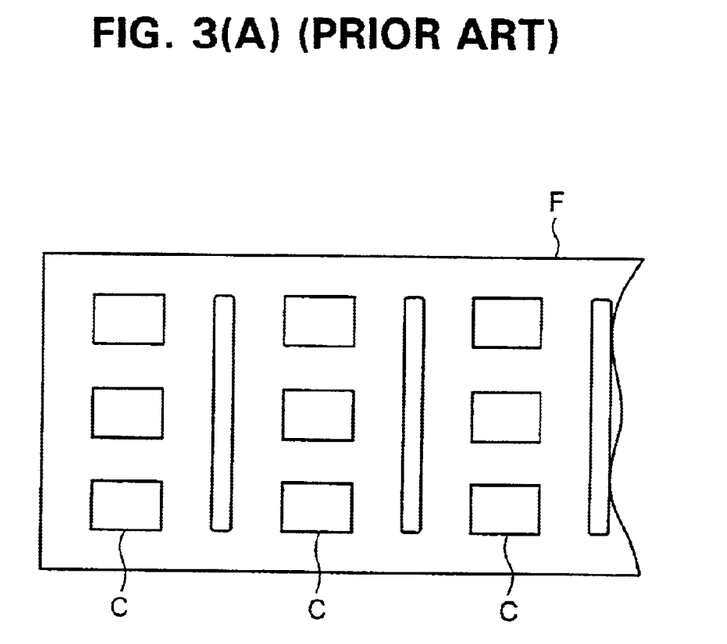
FIGS. 3(A) and 3(B) are explanatory views of a frame of the individually molded type.
Figure 3B:
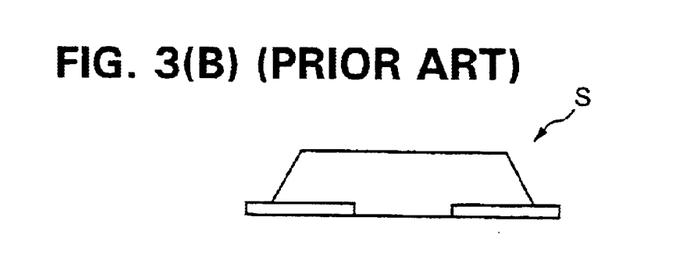

In the frame of the individually molded type, as shown in FIG. 3(A), individual molding cavities C of small size are provided separately within a frame F. After molding, individual semiconductor packages are stamped out so that semiconductor packages S shown in FIG. 3(B) are obtained. Namely, semiconductor devices are mounted on die-pads of lead frames through silver paste and others, and wire bonding is carried out. Thereafter, respective semiconductor devices are individually molded with molding compound and the respective molded semiconductor devices are stamped out to form individual semiconductor packages.

Figure 4A:
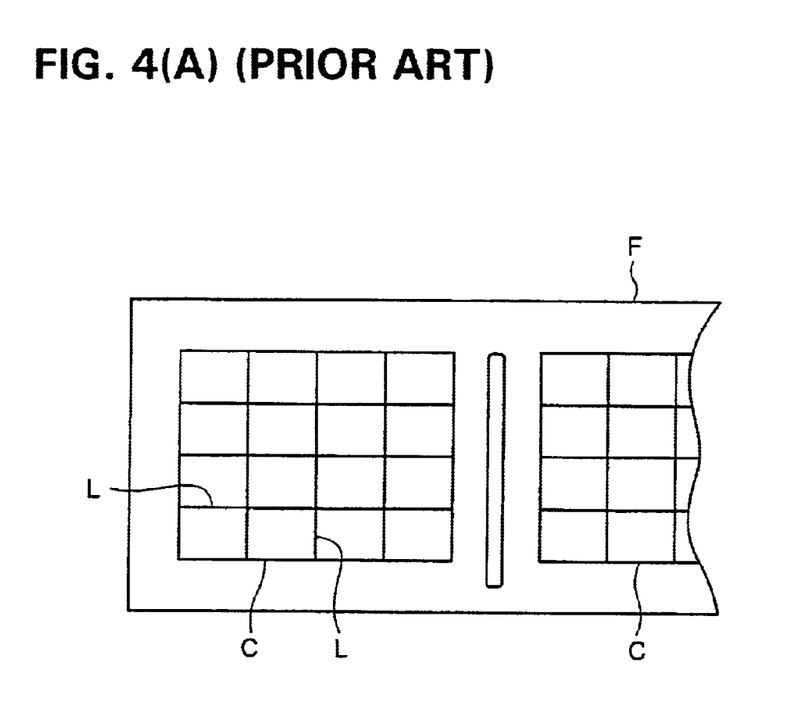
FIGS. 4(A) and 4(B) are explanatory views of a frame of the collectively molded type.
Figure 4B:
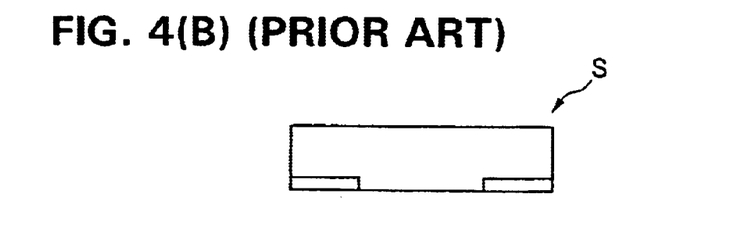

In the frame of the collectively molded type, as shown in FIG. 4(A), some molding cavities C of large size are provided within a frame F. Multiple semiconductor devices are arranged in a matrix formation within each molding cavity C, respectively and collectively molded with molding compound. Thereafter, the collectively molded semiconductor devices are cut at grid-leads L by means of a dicing saw so that a semiconductor package S shown in FIG. 4(B) is obtained. Namely, semiconductor devices are mounted on die-pads of lead frames through silver pastes and others and wire bonding is carried out. Thereafter, plural semiconductor devices are collectively molded with molding compound to a given cavity size, and then the collectively molded semiconductor devices are cut to form individual semiconductor packages by dicing.

In the above-mentioned semiconductor package of the collectively molded type, plural semiconductor devices are arranged in a matrix and collectively molded with molding compound. Thereafter, the collectively molded semiconductor devices are divided into individual semiconductor packages. In this case, the collectively molded semiconductor devices are cut at grid-leads by means of a dicing saw, while terminals of the lead frame are cut off from the grid-leads.

Figure 5:
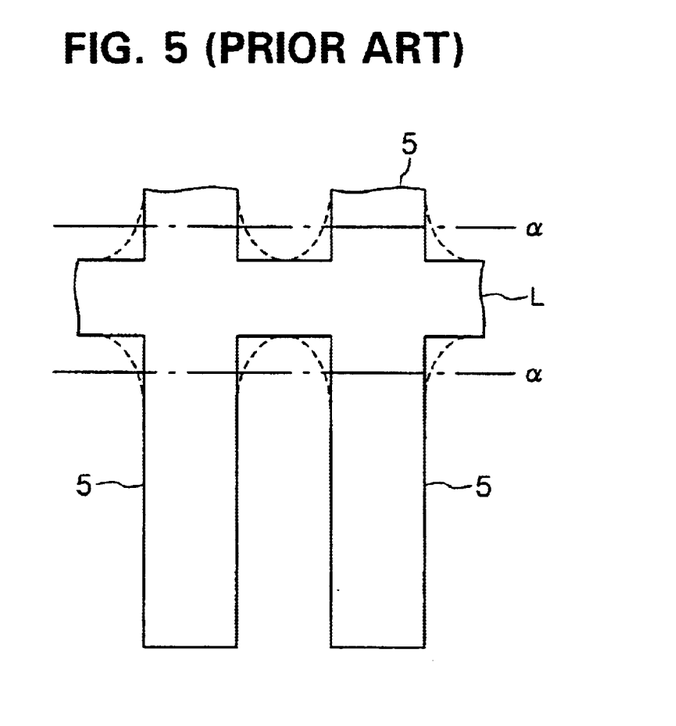
FIG. 5 is an explanatory view of an R-shape generated by etching.
Figure 6:
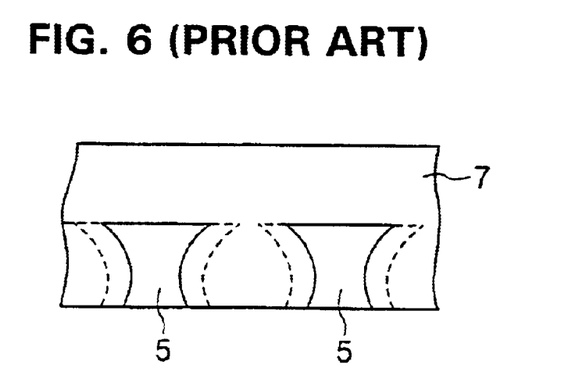
FIG. 6 is an explanatory view showing a state where cut surfaces of the terminals are exposed.

Generally, in the case of producing products by etching, parts designed to form a right angle are finished to have a roundish shape (R-shape), no matter how the etching process is carried out. In a frame for a semiconductor package of the collectively molded type, even if connecting parts of grid-leads L which define the terminals 5 of lead frames are intended or designed to form right angles, products cannot be obtained as designed, since etched products have an R-shape as shown in FIG. 5. Further, as shown by the dotted line in FIG. 6, cut surfaces of terminals 5 of lead frame which are exposed after cutting of the molded resin 7 to form individual semiconductor packages (which are formed by dividing the collectively molded semiconductor devices at cut line a by dicing) approach each other because the R-shape is formed at the roots of terminals 5. Accordingly, a problem arises in that accidental short circuiting can be caused by a soldered bridge.

BRIEF SUMMARY OF THE INVENTION

An object of the present invention is to provide a frame for a semiconductor package of the collectively molded type used for the production of semiconductor packages, in which accidents such as a soldered bridge are prevented.

In order to achieve the above-mentioned object, a first type of frame for a semiconductor package of the present invention comprises plural lead frames arranged in a matrix through grid-leads, the grid-leads having terminals projecting from the grid-leads, in which respective semiconductor devices are mounted on die-pads supported with suspending leads of individual lead frames, the semiconductor devices are collectively molded with molding compound, and the collectively molded semiconductor devices are cut into individual semiconductor packages at grid-leads, wherein thin parts are formed in areas corresponding to the neighborhood of the roots of individual terminals, the thin parts being formed by half-cutting or half-etching metal of the areas from the front or back thereof.

Further, a second type of frame for a semiconductor package of the present invention comprises plural lead frames arranged in a matrix through grid-leads, the grid-leads having terminals projecting from the grid-leads, in which respective semiconductor devices are mounted on die-pads supported with suspending leads of individual lead frames, the semiconductor devices are collectively molded with molding compound, and the collectively molded semiconductor devices are cut into individual semiconductor packages at grid-leads, wherein hollows are formed in areas corresponding to the neighborhood of the roots of individual terminals.

DETAILED DESCRIPTION

Figure 7:
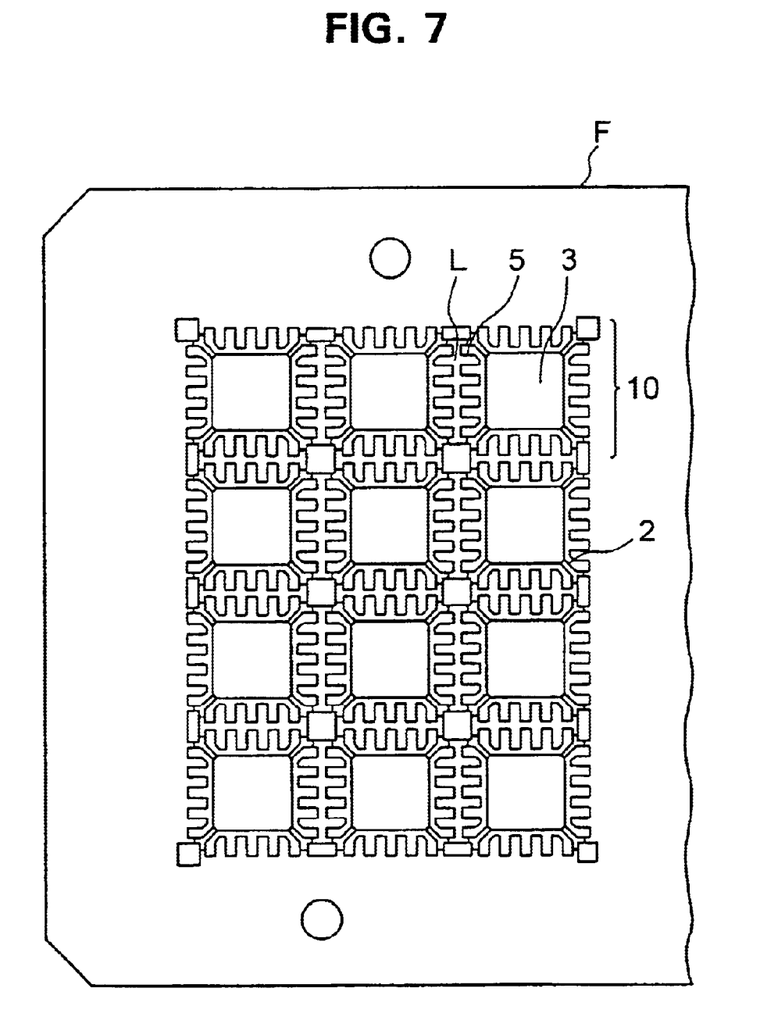
FIG. 7 is a plan view of one example of a first type of frame for a semiconductor package of the present invention.
Figure 8:
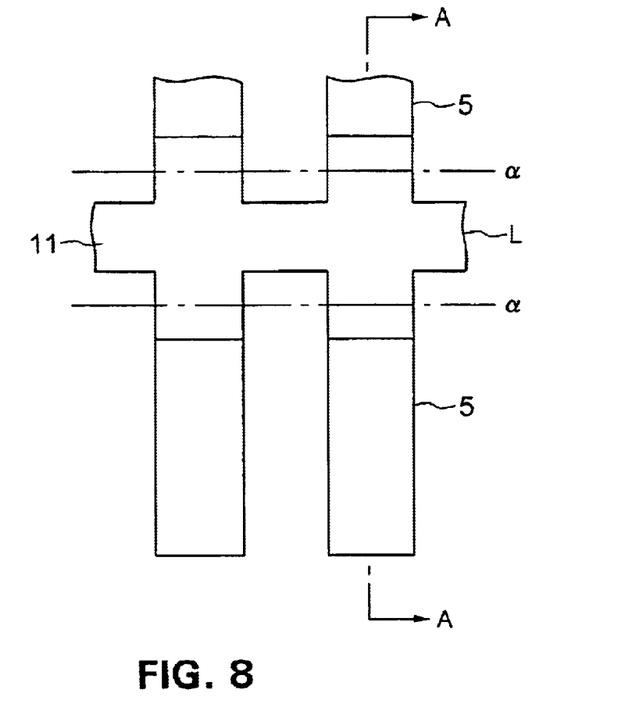
FIG. 8 is a partial enlarged view of the frame shown in FIG. 7.
Figure 9:
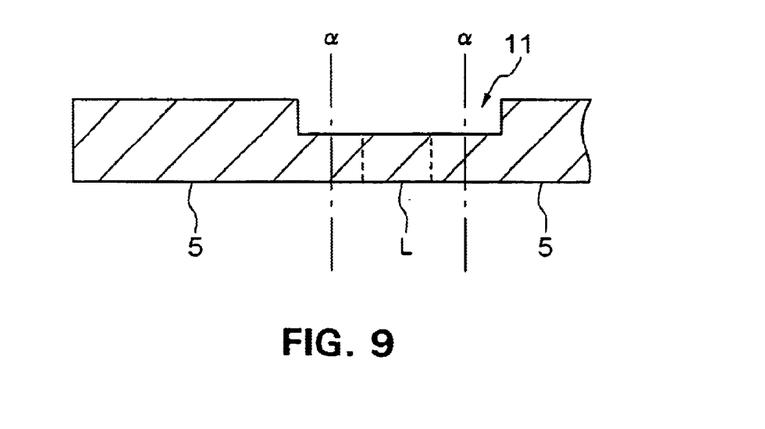
FIG. 9 is a sectional view taken on line A—A in FIG. 8.

Referring to the figures, embodiments of the present invention are explained. FIG. 7 is a plan view of one example of a first type of a frame for a semiconductor package of the present invention. FIG. 8 is a partial enlarged plan view of the frame shown in FIG. 7. FIG. 9 is a sectional view taken on line A—A in FIG. 8.

In these figures, F designates a metal frame for lead frames, in which lead frames 10 are arranged in a matrix of 3×4 through grid-leads L. The grid-leads L connect terminals S of adjacent lead frames 10 with each other. As shown in FIGS. 8 and 9, areas in the neighborhood of the roots of terminals connected by grid-leads L are provided with thin parts 11 which are formed by half-etching the metal of the areas. The thin parts 11 are formed outside of cut lines a cut by means of a dicing saw. Therefore, even if R-shapes are generated at the roots of terminals 5, R becomes smaller by an extent of that the thickness of metal of the areas is decreased, as compared with that of the areas which are not half-cut by etching. Accordingly, a sectional area of terminals 5 cannot be increased at cut lines α.

A process for producing semiconductor packages using the frame F is as follows. First, semiconductor devices are mounted on die-pads 3 of the respective lead frames 10 of frame F through silver pastes and wire bonding is made between terminals 5 of lead frames and electrodes provided on the top face of semiconductor devices. Thereafter, twelve semiconductor devices are collectively molded with molding compound to a given cavity size and then the collectively molded semiconductor devices are cut at grid-leads L by means of a dicing saw in such a manner that terminals 5 of individual lead frames are left, by which the collectively molded semiconductor devices are divided into individual semiconductor packages.

In the individual semiconductor package produced, the area of the terminals 5 which are exposed at the cut surfaces of molded resin cannot be increased. Accordingly, sufficient intervals are-maintained between adjacent terminals 5, to such an extent that accidents such as a soldered bridge are prevented.

In the above-mentioned example, half-cut parts are formed on the front side in the neighborhood of the roots of terminals connected with grid leads. However, even if half-cut parts are formed on the backside by half-cutting or half-etching metal from the backside, the half-cut parts formed on the backside have the same effect.

Figure 10:
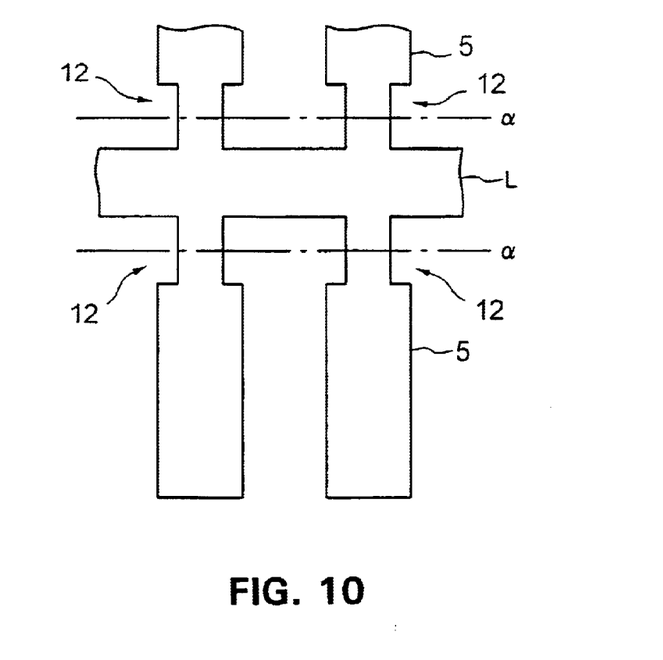
FIG. 10 is a partial enlarged plan view of one example of a second type of frame for a semiconductor package of the present invention.

FIG. 10 is a partial enlarged plan view of one example of a second type of frame for a semiconductor package of the present invention.

The frame is provided with hollows 12 having an angular shape in the neighborhood of the roots of terminals 5. The hollows 12 are formed outside of the cut line. If hollows 12 having such a shape are provided at the roots of terminals 5, problems caused by the R-shape formed at the roots of terminals by etching are solved. Accordingly, sectional areas of terminals 5 are not increased.

Figure 11:
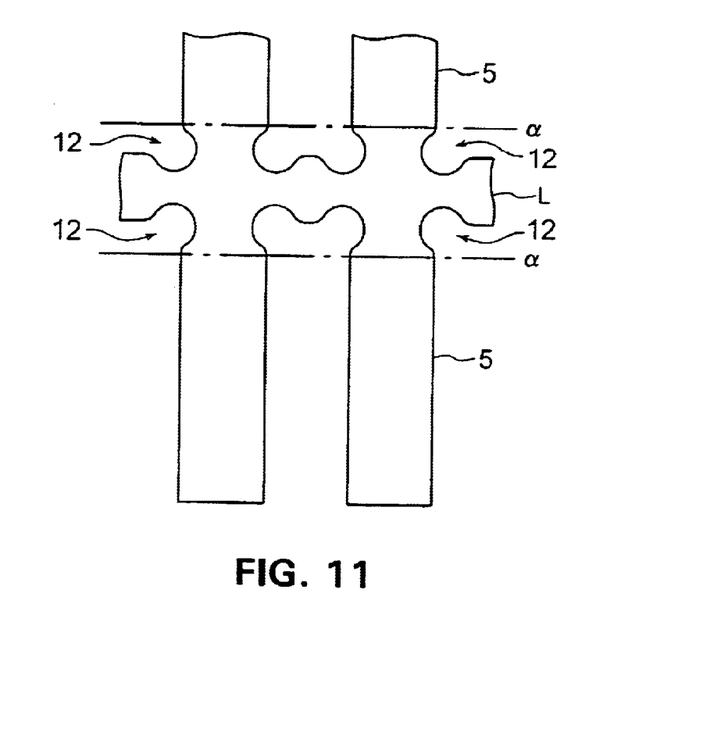
FIG. 11 is a partial enlarged plan view of another example of a second type of frame for a semiconductor package of the present invention.

FIG. 11 is a partial enlarged plan view of another example of a second type of frame for a semiconductor package of the present invention.

The frame has round hollows 12 at the roots of terminals 5. The hollows 12 are formed in such a manner that the hollows cut into a part of grid-leads L from cut line a along which the frame is cut. In the case where hollows 12 having such a shape are provided at the roots of terminals 5, problems caused by the R-shape formed at the roots of terminals by etching are also solved. Accordingly, sectional areas of terminals S are not increased.

In the case of a-semiconductor package produced using a second type of frame as shown in FIGS. 10 and 11, sectional areas of terminals exposed at the cut surface of molded resin do not become larger, so that intervals between adjacent terminals 5 are sufficiently maintained. Accordingly, accidents such as a soldered bridge do not occur.

As mentioned above, a frame for semiconductor package of the present invention comprises plural lead frames arranged in a matrix through grid-leads, the grid-leads having terminals projecting from the grid-leads, in which respective semiconductor devices are mounted on die-pads supported with suspending leads of individual lead frames, the semiconductor devices are collectively molded with molding compound, and the collectively molded semiconductor devices are cut into individual semiconductor packages at grid-leads, wherein thin parts are formed in areas corresponding to the neighborhood of the roots of individual terminals, the thin roots being formed-by half-etching metal of the areas from the front or back thereof. Alternatively, hollows are formed in areas corresponding to the neighborhood of the roots of individual terminals. Accordingly, increased sectional areas of terminals are inhibited or prevented, so that intervals between adjacent terminals 5 are sufficiently maintained. Accordingly, accidents such as a soldered bridge do not occur.

Although particular preferred embodiments of the invention have been disclosed in detail for illustrative purposes, it will be recognized that variations or modifications of the disclosed apparatus, including the rearrangement of parts, lie within the scope of the present invention.

What is claimed is:

1. A frame for semiconductor packages comprising plural lead frames arranged in a matrix through grid-leads, the grid-leads having terminals which project therefrom and terminals of adjacent lead frames are connected to one another at respective connection areas, semiconductor devices being respectively mounted on die-pads supported with suspending leads of individual lead frames, the semiconductor devices being collectively molded with molding compound, and the collectively molded semiconductor devices being cut adjacent the grid-leads into individual semiconductor packages, each terminal having a root disposed in the respective connection area defined between interconnected pairs of terminals of adjacent lead frames, each said terminal root defining therein a pair of hollows on respective opposite sides thereof.

2. A frame for forming individual semiconductor packages, said frame comprising a plurality of lead frames arranged in a matrix and semiconductor devices respectively mounted on die pads supported on the individual lead frames by suspending leads, each said lead frame having a metal lead which defines a boundary between said lead frame and an adjacent lead frame, and pairs of terminals project in opposite directions from each said lead disposed between an adjacent pair of lead frames, wherein roots of the respective pairs of interconnected terminals disposed closely adjacent the corresponding lead and projecting outwardly therefrom each have a reduced dimension such that a maximum distance is maintained between laterally adjacent roots of individual lead frames.

3. The frame of claim 2 wherein said roots comprise half-etched areas to reduce the thickness thereof such that after cutting of said frame adjacent said leads to form individual semiconductor packages, said half-etched areas of said roots are exposed and located at the outer peripheries of the respective semiconductor packages.

4. The frame of claim 2 wherein said roots of each interconnected pair of terminals of interconnected lead frames and a portion of the corresponding said lead disposed between said roots are half-etched.

5. The frame of claim 2 wherein said roots comprise half-etched areas to reduce the thickness thereof as defined between front and rear sides of said frame.

6. The frame of claim 2 wherein said terminals of each said lead frame are disposed outwardly of the respective said die pad in surrounding relation therewith.

7. The frame of claim 6 wherein said semiconductor devices are electrically connected to said terminals of the corresponding said lead frame by wires.

8. The frame of claim 2 wherein said frame defines at least one cavity therein, said lead frames and the corresponding said semiconductor devices being disposed in said cavity, said frame further comprising molding compound disposed in said cavity so as to encapsulate upper sides of said semiconductor devices and lower sides of said die pads.

9. A frame for forming individual semiconductor packages, said frame comprising a plurality of lead frames arranged in a matrix and semiconductor devices respectively mounted on die pads supported on the individual lead frames by suspending leads, each said lead frame having a metal lead which defines a boundary between said lead frame and an adjacent said lead frame, and pairs of terminals project in opposite directions from each said lead disposed between an adjacent pair of lead frames, each said terminal having a root disposed closely adjacent and projecting from the corresponding said lead, and each said root being recessed inwardly on opposite sides thereof to define a hollow between laterally adjacent roots of the individual lead frames such that a maximum distance is maintained therebetween.

10. The frame of claim 9 wherein said hollows defined between laterally adjacent roots of the individual lead frames each additionally extend into a portion of the corresponding said lead which extends transversely between said laterally adjacent roots.

11. The frame of claim 10 wherein each said hollow has a rounded shape.

12. The frame of claim 11 wherein said terminals of each said lead frame are disposed outwardly of the respective said die pad in surrounding relation therewith.

13. The frame of claim 12 wherein said semiconductor devices are electrically connected to said terminals of the corresponding said lead frame by wires.

14. The frame of claim 13 wherein said frame defines at least one cavity therein, said lead frames and the corresponding said semiconductor devices being disposed in said cavity, said frame further comprising molding compound disposed in said cavity so as to encapsulate upper sides of said semiconductor devices and lower sides of said die pads.

15. The frame of claim 2 wherein said reduced dimensions of the respective roots each comprise a root width as defined between opposite sides of the respective root.

16. The frame of claim 2 wherein said reduced dimensions of the respective roots each comprise a root thickness as defined between front and rear sides of said frame.

17. A frame for forming individual semiconductor packages, said frame comprising a plurality of lead frames arranged in a matrix and semiconductor devices respectively mounted on die pads supported on the individual lead frames by suspending leads, each said lead frame having a metal lead which defines a boundary between said lead frame and an adjacent said lead frame, and pairs of terminals project in opposite directions from each said lead disposed between an adjacent pair of lead frames, each said terminal having a root defining a recessed area therein and being disposed closely adjacent and projecting from the corresponding said lead.

* * * * *